United States Patent [19]

Milkovic et al.

[11] Patent Number: 4,912,423
[45] Date of Patent: Mar. 27, 1990

[54] CHOPPER-STABILIZED OPERATIONAL TRANSCONDUCTANCE AMPLIFIER

[75] Inventors: Miran Milkovic, Scotia, N.Y.; David R. Regenold, Mesa, Ariz.

[73] Assignee: General Electric Company, Schenectady, N.Y.

[21] Appl. No.: 315,960

[22] Filed: Feb. 27, 1989

[51] Int. Cl.$^4$ ............................................. H03F 3/16
[52] U.S. Cl. ...................................... 330/9; 330/255; 330/288; 330/277
[58] Field of Search .................... 330/9, 51, 293, 255, 330/257, 264, 269, 277, 288; 307/497; 323/315, 316

[56] References Cited

U.S. PATENT DOCUMENTS

| | | | |
|---|---|---|---|
| 3,614,645 | 10/1971 | Wheatley, Jr. | 330/30 D |
| 4,360,785 | 11/1982 | Schade, Jr. | 330/261 |
| 4,361,815 | 11/1982 | Schade, Jr. | 330/288 X |
| 4,459,555 | 7/1984 | Jett, Jr. | 330/288 X |
| 4,733,171 | 3/1988 | Milkovic | 324/142 |
| 4,808,942 | 2/1989 | Milkovic | 330/9 |

OTHER PUBLICATIONS

"A Use of Limit Cycle Oscillators to Obtain Robust Analog to Digital Converters", J. G. Candy, IEEE Transactions on Communications, vol. COM-27, No. 3, pp. 298-305, Mar. 1974.
"Using Triangularly Weighter Interpolation to Get 13-Bit PCM from a Sigma-Delta Modulator", J. G. Candy et al., IEEE Transactions on Communications, vol. COM-24, No. 11, pp. 1268-1275, Nov. 1976.
"A Use of Double Integration in Signal Delta Modulation", J. G. Candy, IEEE Transactions on Communications, vol. COM-33, No. 3, pp. 249-258, Mar. 1985.
"Circuit and Technology Considerations of MOS Delta-Sigma AID Converters", M. W. Hauser et al., 1986, IEEE International Symposium on Circuits and Systems Proceedings, pp. 1310-1315, May 1986.
"A Low-Noise Chopper-Stabilized Differential Switched-Capacitor Filtering Technique", K.-C. Hsieh et al., IEEE Journal of Solid-State Circuits, vol. SC-16, No. 6, pp. 458-465.
"Current Gain High Frequency CMOS Operational Amplifiers", M. Milkovic, IEEE Journal Solid-State Circuits, vol. SC-20, No. 4, pp. 845-851, Aug. 1985.

Primary Examiner—Steven Mottola
Attorney, Agent, or Firm—Al L. Limberg; James C. Davis, Jr.; Marvin Snyder

[57] ABSTRACT

Current mirror amplifiers are disclosed, each having first and second ports that can be interchanged as to which is input port and which is output port in response to an electric control signal. A chopper-stabilized differential amplifier that uses such a switchable current mirror amplifier as a balanced-to-single-ended signal converter for output signals is disclosed, which chopper-stabilized differential amplifier is particularly suited for the integrating amplifier in a delta-sigma analog-to-digital converter.

43 Claims, 5 Drawing Sheets

CHOPPER-STABILIZED OPERATIONAL TRANSCONDUCTANCE AMPLIFIER

An aspect of the invention concerns switched current mirror amplifiers having first and second ports, the choice of which is to be input port and which is to be output port being electrically controlled. Another aspect of the invention is the use of such switched current mirror amplifiers in operational transconductance amplifiers, such as those used in the integrators for delta-sigma modulators, as part of the circuitry for chopper-stabilizing and operating characteristics of these operational transconductance amplifiers.

BACKGROUND OF THE INVENTION

A number of electronic circuits (such as differential current amplifiers or differential transductance amplifiers) supply balanced output currents, which are converted to single-ended output currents using current mirror amplifiers as balanced-to-single-ended converters. These current mirror amplifiers each have an output current that is the same magnitude as applied input current and flows in the same direction as applied input current. i.e., the current gain of each of these current mirror amplifiers is minus unity.

In some applications it is desirable to be able to control which of the balanced output currents is selected to be inverted and which is not. A representative application is the chopper-stabilized amplifier that is used in the integrator of a delta-sigma modulator.

The delta-sigma modulator is a form of analog-to-digital converter well-known to those skilled in the art of designing such converters. The reader is referred to the following technical articles incorporated herein by reference.

(1) "A Use of Limit Cycle Oscillators to Obtain Robust Analog to Digital Converters", J. G. Candy, IEEE TRANSACTIONS ON COMMUNICATIONS, Vol. COM-27, No. 3, pp. 298–305, March 1974

(2) "Using Triangularly Weighted Interpolation to Get 13-Bit PCM from a Sigma-Delta Modulator", J. G. Candy, et al., IEEE TRANSACTIONS ON COMMUNICATIONS, Vol. COM-24, No. 11, pp. 1268–1275, November 1976

(3) "A Use of Double Integration in Signal Delta Modulation", J. G. Candy, IEEE TRANSACTIONS ON COMMUNICATIONS, Vol COM-33, No. 3, pp. 249–258, March 1985

(4) "Circuit and Technology Considerations for MOS Delta-sigma A/D Converters", M. W. Hauser, et al., 1986, IEEE INTERNATIONAL SYMPOSIUM ON CIRCUITS AND SYSTEMS PROCEEDINGS, pp. 1310–1315, May 1986

(5) "A Low-Noise Chopper-Stabilized Differential Switched-Capacitor Filtering Technique", K.-C. Hsieh, et al., IEEE JOURNAL OF SOLID-STATE CIRCUITS, Vol. SC-16, No. 6, pp. 708–715, December 1981.

In a delta-sigma modulator an analog input signal has a quantized analog signal subtracted therefrom to generate an error signal. This error signal is integrated over time, and the resulting integral is supplied to a quantizer to be digitized. The quantizer includes means for generating the quantized analog signal as well, such as digital-to-analog converter for the digital signal from the quantizer, completing a direct feedback connection. The delta-sigma modulator is operated at a relatively high sample rate $f_s$ compared to the rate $f_{out}$ at which an interpolated value of digitized input signal is to be developed as a final output signal of the analog-to-digital converter. The digital output signal from the quantizer of the delta-sigma modulator is then subjected to averaging over cycle of repeated operations of the delta-sigma modulator, $f_s/f_{out}$ in number. This averaging may be done by accumulating the digital output from the quantizer over $(f_s/f_{out})$ operations, then dividing the accumulation by $(f_s/f_{out})$ to obtain an interpolated value of the digitized input signal as output signal. This division is a simple matter of binary place shifting when $(f_s/f_{out})$ is an integral power of two. This paragraph has described a first-order delta-sigma modulator, with a single integrator included in the direct feedback loop, per the March 1974 J. G. Candy article, being used to implement an oversample and decimate analog to digital converter.

One may view the averaging to obtain the interpolated value of the digitized input signal as being a low-pass digital filtering procedure used to suppress quantizing noise, which is above-band. Low-pass filtering techniques for suppressing quantizing noise that are more sophisticated than the simple accumulate-and-divide technique are known—e.g., from the November 1976 Candy et alii article which describes triangularly weighted kernels for such filtering. With ideal low-pass filtering for suppressing quantizing noise, effectively the number N of bits of resolution in the output signal of the prior-art analog-to-digital converter using a first-order delta-sigma modulator is approximately $[1.5 \log_2(f_s/f_{out})] - 0.9$.

In addition to first-order delta-sigma modulators, delta-sigma modulators with additional integrating loops are also possible. This is described in the March 1985 J. G. Candy article.

As pointed out by Hauser et alii, there are many different forms of oversample and decimate analog-to-digital converters, but those of special interest are the ones where the error signal is forced to have single-bit resolution, inasmuch as this avoids the need for precision binary elements in the digital-to-analog converter used to complete the feedback loop. The goal is to obtain maximum precision in the analog-to-digital process with minimal requirement for precision in the circuit elements employed in the analog-to-digital converter.

Hsieh et alii point out that achievement of this goal is furthered by the use of differential chopper-stabilized configurations, particularly in switched-capacitor designs using metal-oxide-semiconductor field effect transistors (MOSFETs) as switches. Chopper stabilization of the differential amplifier in the integrator also translates its low-frequency, or 1/f, noise above-band where it is suppressed by the delta-sigma modulator output signal digital filter. A drawback of the Hsieh et alii analog-to-digital converter is its need for balanced push-pull analog input signals. As noted by Hauser et alii, performance of delta-sigma analog-to-digital converters using MOSFET switches is usually constrained by analog circuit imperfections.

The design problem posed to the present inventors was to develop a fully integrated delta-sigma analog-to-digital converter that is capable of accepting an input signal that lies between the confines of a single-ended power supply and generating responsive to this input signal a single-bit data stream switching between the confines of that power supply, which data stream has an average absolute value equal to the average absolute value of the input signal. The converter is required to withstand input voltages extending outside the normal range of 0 to −5 volts by as much as an additional −25 volts. The analog-to-digital converter is required to have less than 0.5% gain error owing to element mismatch and to exhibit no more than 0.5 mV offset error. This latter requirement is an especially rigorous one to meet and mandates the use of some sort of error compensation, such as that afforded by chopper stabilization of the integrating amplifier. However, the means for chopper stabilizing single-ended (as opposed to balanced) amplifiers using single-ended (as opposed to balanced) power supplies requires a substantial advance in the art from the balanced differential chopper-stabilized configurations as exemplified by Hsieh et alii.

C. F. Wheatley in U.S. Pat. No. 3,614,645 issued Oct. 19, 1971 and entitled "DIFFERENTIAL AMPLIFIER" describes an operational transconductance amplifier that employs transconductance amplifiers rather than the voltage amplifiers employed in prior-art operational (voltage) amplifiers. Input impedances of the operational transconductance amplifiers are high, just as in operational voltage amplifiers, but output impedances are also high rather than low as in operational voltage amplifiers. The typical operational transconductance amplifier structure comprises a long-tailed pair input stage supplying balanced signal currents to a balanced-input/balanced-output current mirror amplifier supplying balanced signal currents to the input and output connections of a current mirror amplifier operated as a balanced to single-ended converter. The balanced-input/balanced-output current mirror amplifier is sometimes realized as two separate current mirror amplifiers, one for each of the balanced signals from the long-tailed pair. The operational transconductance amplifier (OTA) is well suited for use as an integrating amplifier, wherein the OTA non-inverting input terminal is connected to a reference potential against which input voltage is to be measured, wherein the OTA inverting input terminal is connected to input signal voltage via a resistor that responds to the input signal voltage to conduct an input signal current, and wherein an integrating capacitor is connected in a degenerative feedback path from the OTA output terminal to the OTA inverting input terminal. This form of integrating amplifier is that selected for the delta-sigma modulator, and the problem of chopper-stabilizing a single-ended integrating amplifier is accordingly focussed to the more-closely-defined problem of chopper-stabilizing an operational transconductance amplifier.

Delta-sigma modulators are well-suited to construction in monolithic integrated circuits employing metal-oxide-semiconductor (CMOS) transistors, and chopper-stabilized operational transconductance amplifiers that are constructed in that monolithic integrated-circuitry technology are of particular interest. Operational transconductance amplifiers constructed in CMOS technology are described by M. Milkovic, the present inventor, in the paper "Current Gain High-Frequency CMOS operational Amplifiers" in the *IEEE JOURNAL OF SOLID STATE CIRCUITS*, Vol. SC-20, No. 4, pp. 845–851, published in August 1985; the OTA shown in FIG. 10 of that article can be chopper-stabilized in accordance with the invention.

Presuming the operational transconductance amplifier is to be powered from a single-ended power supply between a reference voltage at substrate ground and a positive power supply voltage, and presuming that it is desired to operate the input of the operational transconductance amplifier single-ended against that substrate ground potential, it is desirable that the OTA have the capability of accepting input voltage swings that are negative as well as positive referred to substrate ground potential. O. H. Schade, Jr., in U.S. Pat. No. 4,360,785 issued Nov. 23, 1982 and entitled "TRANSISTOR AMPLIFIERS EXHIBITING LOW INPUT OFFSET POTENTIALS" describes enhancement-mode p-channel field-effect transistors in long-tailed pair connection being used in the input stage of a monolithic integrated circuit constructed on a p-type silicon substrate. The p-channel field effect transistors permit input signals to swing below ground potential in a monolithic integrated circuit constructed on a p-type silicon substrate connected to ground potential, despite the electronic circuitry being provided with at least one positive power supply voltage but not any negative power supply voltage. The Schade, Jr., monolithic integrated circuitry was constructed in a technology permitting n-p-n bipolar transistors, so the application of output currents from the long-tailed-pair connection of the enhancement-mode p-channel field-effect transistors to further amplifier stages could be done in a straight forward manner. When a chopper-stabilized operational transconductance amplifier embodying the present invention is operated with single-ended power supply and is constructed in a CMOS technology that is optimized for complementary symmetry of the operating characteristics of p-channel and n-channel enhancement-mode field effect transmissions, a substantial modification of the Schade, Jr., teaching in regard to p-channel field-effect transistor input stages must be made to accomodate n-channel enhancement-mode field effect transistors rather than n-p-n bipolar transistors being available for use in succeeding stages.

SUMMARY OF THE INVENTION

The invention in one of its aspects concerns current mirror amplifiers that include electric switches responding to control signals to interchange the input and output ports of those amplifiers.

The invention in a further aspect concerning chopper-stabilized operational transconductance amplifiers is embodied in an operational transconductance amplifier having as its output stage a balanced-to-single-ended signal converting current mirror amplifier the input and output device of which can be selectively interchanged responsive to a chopping signal. The connections of the inverting and non-inverting input terminals of the operational transconductance amplifier to the input connections of the long-tailed pair input stage are also selectively interchanged by electronic switches responsive to the chopping signal. In preferred embodiments of the invention in regard to chopper-stabilized operational transconductance amplifiers, a long-tailed pair of n-channel enhancement-mode field-effect transistors is preceded by a p-channel enhancement-mode field-effect transistors in grounded-drain amplifier connections for signals received from the inverting and non-inverting input terminals of the operational transconductance amplifier and applied by source-follower operation to the long-tailed pair.

Figure 1A:
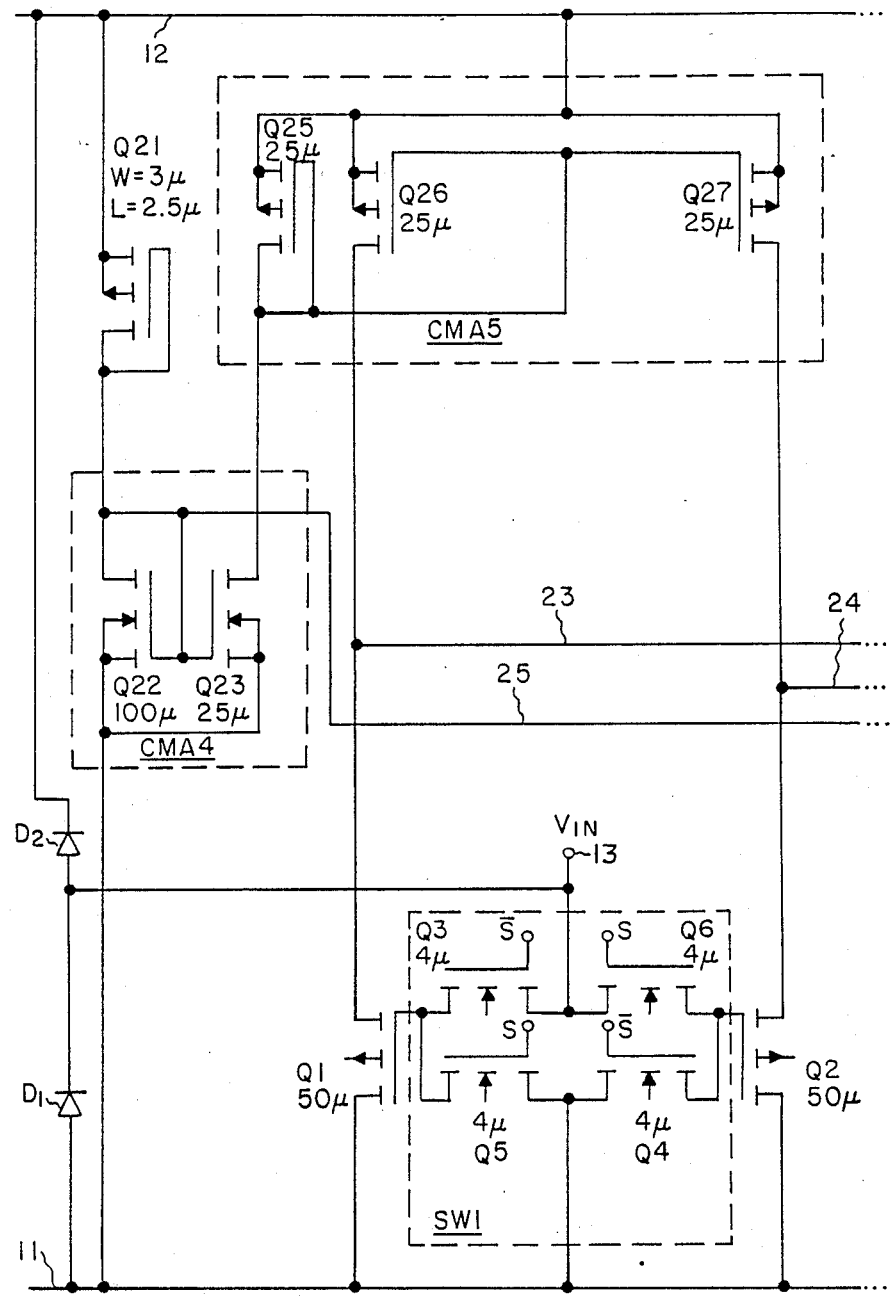
FIGS. 1A and 1B are schematic diagrams of a chopper-stabilized operational transconductance amplifier embodying the invention, drawn on two plates as FIGS. 1a and 1b which are considered respectively to the left and to the right of each other.

In the drawing, substrate electrodes of field effect transistors may not have their connections within the monolithic integrated circuit shown. In the case of p-channel transistors, they convert to the most positive direct potential bus; and, in the case of n-channel transistor, they connect to the most negative direct potential bus.

DETAILED DESCRIPTION

Figure 1B:
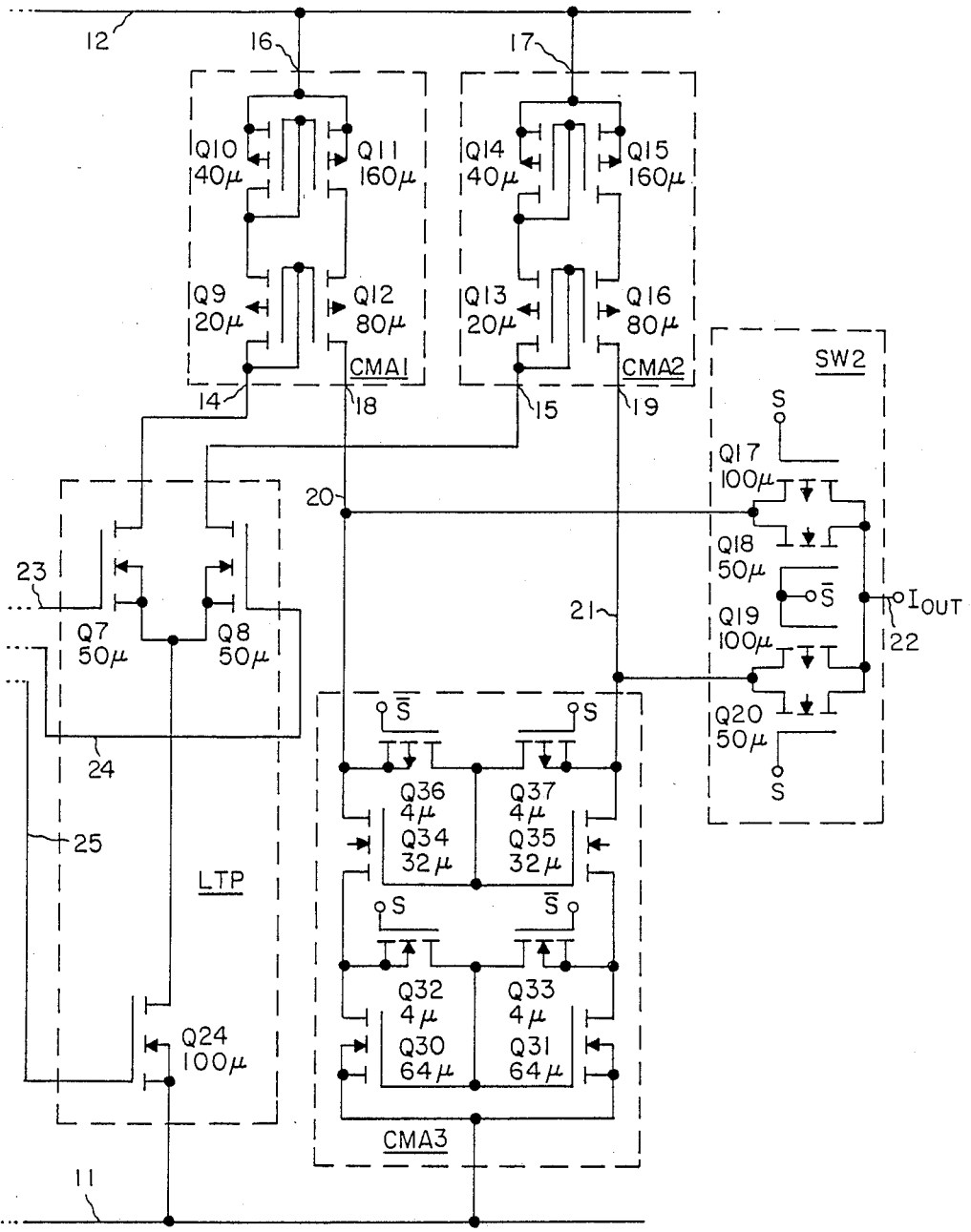

The FIG. 1 chopper-stabilized operational transconductance amplifier is constructed in COMOS technology on p-type silicon substrate electrically connected to a supply rail 11 shown as being at ground reference potential. The substrate electrodes of n-channel field effect transistors, unless shown connected otherwise, connect to supply rail 11. A supply rail 12 is connected to receive a relatively positive supply voltage $V_{STANDARD}$, to which the substrate electrodes of p-channel field effect transistors connect. A chopping control signal that switches between ground reference potential or zero voltage, and the positive supply voltage $V_{STANDARD}$ is supplied in two complementary phases S and $\bar{S}$ via respective terminals and control lines extending therefrom through the integrated circuit. To make the circuit diagram simpler to comprehend, these control lines are omitted from FIG. 1 and further terminals for S and $\bar{S}$ are provided in FIG. 1.

A single-ended input voltage $V_{IN}$ is applied at an input terminal 13. Catcher diodes $D_1$ and $D_2$ contained input terminal 13 potential to be no more than a few tenths volt more negative than rail 11 potential or more positive than rail 12 potential. $V_{IN}$ and ground reference potential are selectively supplied to separate ones of the gate electrodes of p-channel field-effect transistors Q1 and Q2 by an input chopper switch SW1 compressing n-channel enhancement-mode field effect transistors Q3, Q4, Q5, Q6 operated as selective transmission gates. When the S phase of the chopper control signal is high (at $V_{STANDARD}$) and the $\bar{S}$ phase is low (at ground), Q3 and Q4 are non-conductive, but Q5 is conductive to apply ground reference potential to Q1 gate electrode and Q6 is conductive to apply $V_{IN}$ to Q2 gate electrode. When S phase of the chopper control signal is low and $\bar{S}$ phase is high, Q5 and Q6 are non-conductive, but Q4 is conductive to apply ground reference potential to Q2 gate electrode and Q3 is conductive to apply $V_{IN}$ to Q1 gate electrode.

P-channels FETs Q1 and Q2 are common-drain-amplifiers applying through source-follower operation the potentials received at their gate electrodes to lines 23 and 24 and thence to the gate electrodes of a long-tailed-pair connection LTP of n-channel enhancement-mode FETs Q7 and Q8. The drain electrode of Q7 connects to the input connection 14 of a first current mirror amplifier CMA1 comprising p-channel enhancement-mode FETs Q9, Q10, Q11 and Q12 in a connection similar to that described for bipolar n-p-n transistors by H. A. Wittlinger in U.S. Pat. No. 3,835,410 issued Sep. 10, 1974 and entitled "CURRENT AMPLIFIER". The drain electrode of Q8 connects to the input connection 15 of a second current mirror amplifier CMA2 comprising p-channel enhancement-mode FETs Q13, Q14, Q15 and Q16. CMA1 and CMA2 have common connections 16 and 17 to positive rail 12 and exhibit similar current gains, here −4, achieved by scaling of the physical dimensions of their respective component FETs. Together CMA1 and CMA2 function as a balanced-input balanced-output current mirror amplifier for supplying from their respective output connections 18 and 19 to nodes 20 and 21 balanced amplified current responses to the balance drain currents of long-tailed pair transistors Q7 and Q8.

Responsive to the chopper control signal an input chopper switch SW2 selects either node 20 (and thus output connection 18 of CMA1) or node 21 (and thus output connection 19 of CMA2) for connection to an output terminal 22 of the chopper stabilized amplifier. A switched third current mirror amplifier CMA3 responds to the current flow from the output connection 18 and 19 not selected for connection to output terminal 22 to demand a similar-value current flow at the node 20 and 21 selected for connection to output terminal 22. In order for this to be done, CMA3 is switched in such matter as that its input and output ports can be interchanged responsive to the chopper control signal, as shall be explained in detail further on in this specification.

In output chopper switch SW2, a p-channel field effect transistor Q17 and an n-channel field effect transistor Q18 are connected as a dual transmission gate responsive to S and $\bar{S}$ phases of chopper control signal applied to their respective gate electrodes. Q17 and Q18 conduct when S and $\bar{S}$ are respectively high and low to connect node 20 to output terminal 22 and do not conduct when S and $\bar{S}$ are respectively low and high. A p-channel field effect transistor Q19 and an n-channel field effect transistor Q20 conduct when S and $\bar{S}$ are respectively low and high to connect node 21 to output terminal 22 and do not conduct when S and $\bar{S}$ are respectively high and low. Q17, Q18, Q19 and Q20 are shown as being enhancement-mode types. The FIG. 1 amplifier is made to be an inverting amplifier between its input terminal 13 and its output terminal 22, and inverting gain is desired of an operational amplifier used in an integrating amplifier formed by connecting a feedback capacitor from output to its input terminal. In other chopper-stabilized OTAs the interconnection between Q3 and Q6 channels could be grounded and the connection from input terminal 13 could be relocated to the interconnection between Q4 and Q5 channels, to result in a non-inverting amplifier.

Self-biased enhancement-mode p-channel field effect transistor Q21 functions as a bleeder resistor for supplying bleeder input current to a fourth current mirror amplifier CMA4. CMA4 includes a self-biased n-channel field effect transistor Q22 developing a potential thereacross responsive to bleeder input current, which potential is applied as source-to-gate potential to n-channel field effect transistors Q23 and Q24. Q23 is an output transistor for CMA4 demanding an output current from the input port of a dual-output fifth current mirror amplifier CMA5, supplying from its two output ports quiescent source currents to the common-drain amplifier transistors Q1 and Q2. CMA4 also may be considered as a dual-output current mirror amplifier, that includes Q24, its first output port being between the source and drain electrodes of Q23 and its second output port being between the source and drain electrodes of Q24. Q24 is shown as receiving gate bias via a line 25 from CMA4 and being considered to be part of the long-tailed pair connection LTP—namely, a constant-current generator used in lieu of a large tail resistor in the tail connection. In CMA5 self-biased p-channel field-effect transistor Q25 develops a potential thereacross responsive to the drain current demand of Q23 in CMA4, which potential applied as source-to-gate potentials of p-channel field effect transistors Q26 and Q27 conditions them to supply drain currents to the source electrodes of common-drain amplifier transistors Q1 and Q2.

The reader is asked to return his attention to the switched current-mirror amplifier CMA-3 used as a balanced-to-single ended signal converter, responding to current supplied to the one of the nodes 20 and 21 not selected by output chopper switch SW2 to output terminal 22, thereby to provide inverted response to that current to the other of nodes 20 and 21. In CMA3 matched n-channel field effect transistors Q30 and Q31 have gate electrodes at the same potential and operate as separate ones of a master and a slave transistor for current mirror amplification, as determined by which of the n-channel field effect transistors Q32 and Q33 is conductive. One of further n-channel field effect transistors Q34 and Q35 operates in cascade with the slave transistor and the other of Q34 and Q34 is conditioned to generate a potential offset for biasing both their gate electrodes, as determined by which of p-channel field effect transistors Q36 and Q37 is conductive through its channel. Each of transistors Q32, Q33, Q36 and Q37 is a single transmission gate, dual transmission gates not being preferred because of the extra area they would take up on the integrated-circuit die. Since the channels of Q32 and Q33 connect nodes never subjected to more than four volts, these single transmission-gate transistors are made n-channel; and since the channels of Q36 and Q37 connect nodes always expected to be at potentials of at least one volt, these single transmission-gate transistors are made p-channel.

As previously noted, when the control signal S is high (at plus five volts) and the complementary control signal $\bar{S}$ is low, at zero volts, ground) the output chopper switch SW2 connects node 21 to the output terminal 22. It is desired that CMA3 at that time be switched so as to have an input port between node 20 and ground rail 11 to receive the drain current flow from Q12 as its input current and so as to supply inverted current response from an output port between ground rail 11 and node 21. $\bar{S}$ applied to the gate electrode of p-channel Q36 being low conditions the channel of Q36 to be fully conductive, clamping the gate electrodes of Q34 and Q35 to Q34 drain potential. S applied to the gate electrode of n-channel Q32 being high conditions the channel of Q32 to be fully conductive, clamping the gate electrodes of Q30 and Q31 to Q30 drain potential. $\bar{S}$ applied to the gate electrode of n-channel Q33 being low conditions the channel of Q33 to be non-conductive. S applied to the gate electrode of p-channel Q37 being high conditions the channel of Q37 to be non-conductive. CMA3 is thus conditioned to operate as a Wittlinger cascoded current mirror amplifier with input connection as node 20; output connection at node 21, and common connection to rail 11.

That is, the drain-to-gate connections of Q34 and Q30 self-bias them for conducting the drain current flow from Q12 through their serially connected channels. The drain-to-gate degenerative feedback connection for Q30 conditions it to operate as the master transistor in the current mirror amplifier CMA3 and the absence of drain-to-gate degenerative feedback connection for Q31 conditions it to operate as the slave transistor in CMA3. The source-to-gate potential of self-biased enhancement-mode transistor Q34 adds to the source-to-gate potential of self-biased enhancement-mode transistor Q30 to apply a gate potential to Q35 that conditions it for cascade operation with the slave transistor Q31. The source-follower action of Q35 places a drain potential on Q31 which closely approximates the drain potential on Q30 (that is, the source-follower potential offsets of Q34 and Q35 tend to be similar for similar current flow densities therethrough), which improves the matching of drain currents in Q30 and Q31 by avoiding problems with early effect.

As previously noted, when the control signal S is low (at zero volts, ground) and the complementary control signal $\bar{S}$ is high (at plus five volts), the output chopper switch SW2 connects node 20 to the output terminal 22. It is desired that CMA3 at that time be switched as as to have an input port between node 21 and ground rail 11 to receive the drain current flow from Q16 at its input current and so as to supply inverted current response from an output port between ground rail 11 and node 20. $\bar{S}$ applied to the gate electrode of p-channel Q36 being high conditions the channel of Q36 to be non-conductive. S applied to the gate electrode of n-channel Q32 being low conditions the channel of Q32 to be non-conductive. $\bar{S}$ applied to the gate electrode of n-channel Q33 being high conditions the channel of Q33 to be fully conductive, clamping the gate electrodes of Q30 and Q31 to Q31 drain potential. This conditions Q31 and Q30 to be the master transistor and slave transistor, respectively, of CMA3. S applied to the gate electrode of p-channel Q37 being low conditions the channel of Q37 to be fully conductive, clamping the gate electrodes of Q34 and Q35 to Q35 drain potential to bias Q34 for cascade operation with Q30. CMA3 is thus conditioned to operate as a Wittlinger cascoded current mirror amplifier with input connection at node 21, output connection at node 20 and common connection to rail 11.

Figure 2:
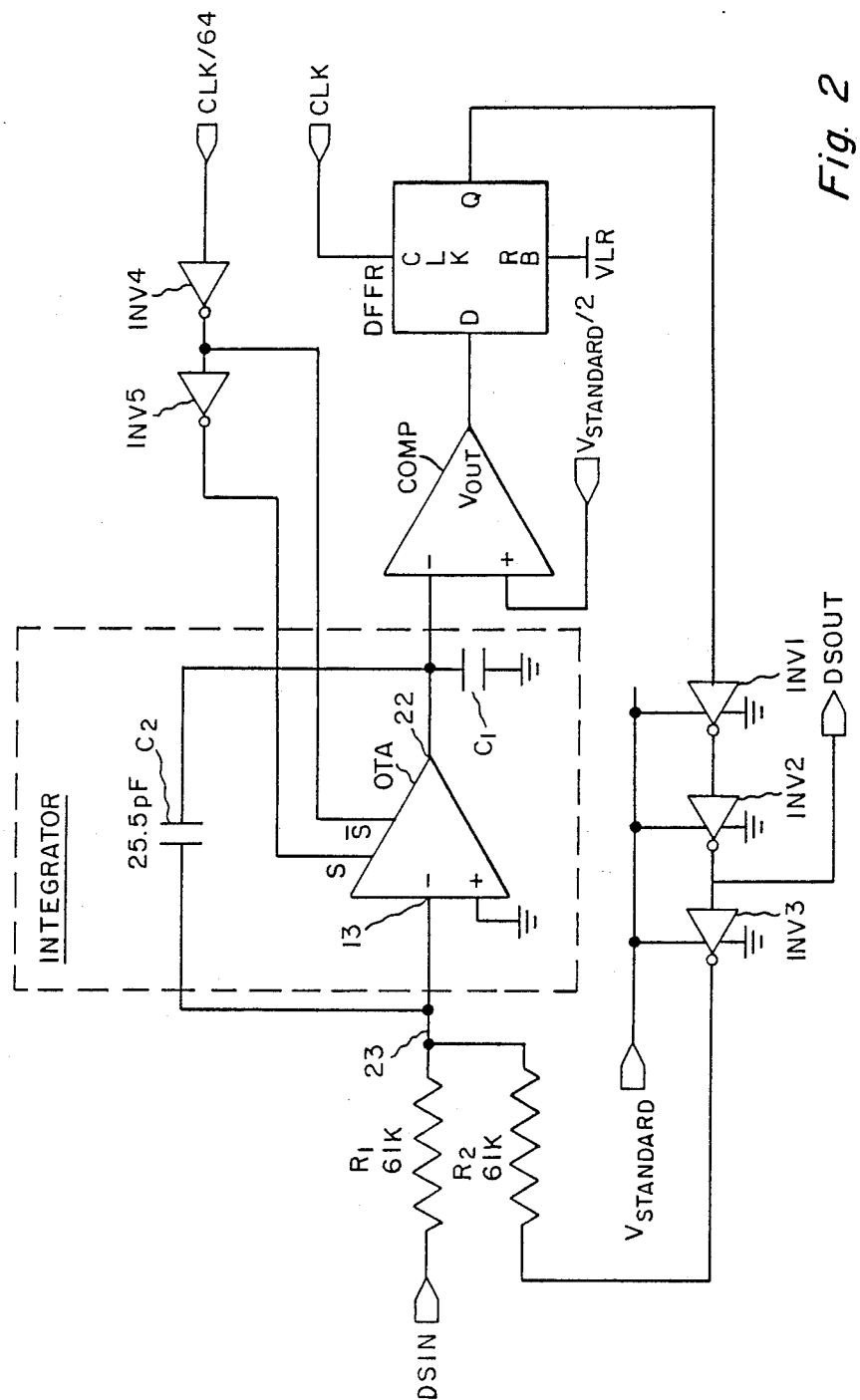
FIG. 2 is a schematic diagram of a delta-sigma modulator incorporating a chopper-stabilized operational transconductance amplifier in accordance with the invention.

FIG. 2 shows a delta-sigma modulator type of analog-to-digital converter that incorporates the FIG. 1 chopper-stabilized operational transconductance amplifier OTA as its integrating amplifier. The analog signal voltage to be converted ranges from $-5$ to 0 volts and is supplied to an input connection DSIN that is connected via a resistor $R_1$ to a node 23. A second resistor $R_2$ connects the output terminal of a logic inverter amplifier INV3 having either a 0-volt or a $+5$-volt output voltage to the node 23. The resistors $R_1$ and $R_2$, which are to have carefully matched resistances can be polysilicon resistors having widths approximately five times as wide as the narrowest resistor width that integrated-circuit design rules permit. This decreases the grain-size to resistor-width ratio to reduce resistance error. Preferably $R_1$ and $R_2$ are geometrically identical, having equal numbers of straight segments and corners, and are interdigitated so that "across-the-wafer" variations in resistivity exert similar influences on their resistances and so do not appreciably impair matching. An error signal current is generated at node 23 which is proportional to the amount by which the output voltage of logic inverter amplifier INV3 differs from the virtual ground appearing at the input connection 13 of OTA, as divided by the resistance of $R_2$, less the amount by which the absolute value of the input voltage applied to DSIN differs from that virtual ground, as divided by the resistance of $R_1$. That is, as inverter INV3 output voltage goes to $V_{STANDARD}$, positive error current signal will flow from node 23 to the integrator; and as inverter output voltage goes to ground, negative error current will flow from node 23 to the integrator.

The integrator comprises the chopper-stabilized operational transconductance amplifier OTA, a shunt capacitance output load $C_1$ for OTA, and a Miller feedback capacitance $C_2$ for OTA. The integrator response to the error signal current supplied from node 23 is supplied to a differential voltage comparator COMP, to be compared against the +2.5 volts half of $V_{STANDARD}$. COMP delivers a ONE or ZERO output signal to the data input port (D) of a flip-flop DFFR of the clocked-data or D type, which is recurrently clocked by the rising edges of a clock signal having a fixed rate of recurrence. The digital value of output signal from the output port (Q) of data flip-flop DFFR is repeatedly logic-inverted in the cascade of logic inverter amplifiers INV1, INV2 and INV3. Output signal from the delta-sigma converter is supplied at an output connection DSOUT thereof, connected from the output port of an earlier one of these logic inverter amplifiers—i.e., INV2 in FIG. 2.

The output voltage of inverter INV3 always either has an absolute value greater than that of DSIN analog signal voltage to cause positive current flow from node 23 into the integrator, or has an absolute value less than that of DSIN analog signal voltage to cause negative current flow from node 23 into the integrator—i.e., positive current flow from the integrator to node 23. The nature of the degenerative feedback loop from OTA output connection 22 through elements COMP, DFFR, INV1, INV2, INV3 and $R_2$ is to regulate the current flows through node 23 to and from the integrator to be equal. The analog signal supplied to the delta-sigma modulator input connection DSIN tends to cause unequal current flows through node 23 to and from the integrator, but this does not in fact happen because the degenerative feedback loop adjusts the number of ONEs and ZEROs that appear at the output connection of inverter INV3 so their long-term average voltage is equal and opposite to the analog signal applied to input connection DSIN.

The long-term average voltage at the output connection of inverter INV3 can be ascertained by counting the number of ONEs occurring during a long succession of clock intervals. Since the counter (not shown in FIG. 2) customarily is constructed of flip-flop triggerable on transitions, and since there are as many transitions from ZERO to ONE as from ZERO to ONE, the counter can be triggered by transitions supplied from the output connection DSOUT to which the input connection of inverter INV3 is made, rather from INV3 output signal, without affecting the count.

The signal S alternates value at a rate that is an even submultiple of the clock signal supplied via a terminal CLK to the data flip-flop DFFR. This signal S is shown as alternating at one-sixtyfourth of DFFR clock rate and being applied to the input connection of an inverter INV4 in FIG. 2. Inverter INV4 acts as a buffer amplifier stage supplying $\bar{S}$ signal from its output connection to the chopper-stabilized operational transconductance amplifier OTA and to the input connection of a further inverter INV5 in cascade after inverter INV4. Inverter INV5 acts as a further buffer amplifier stage, responding to $\bar{S}$ signal to S signal from its output connection to the chopper-stabilizer operational transconductance amplifier OTA. The counter counting transitions in one direction in the signal voltage supplied from DSOUT is recurrently reset with a periodicity that is an even submultiple of the alternation rate of S signal. These rate relationships assure that there is no bias term remnant from chopping in the counter output signal which measures the analog voltage supplied at the input connection DSIN of the FIG. 2 delta-sigma modulator.

The voltage comparator COMP typically is a simple operational amplifier that comprises a long-tailed-pair connection of field-effect transistors for differentially amplifying OTA output voltage less $V_{STANDARD}/2$, a field-effect-transistor current mirror amplifier load for the long-tailed-pair providing balanced-to-single-ended signal conversion, and a subsequent commonsource field-effect transistor stage with the Miller feedback capacitor for establishing the pole in amplifier response. The degenerative feedback loop comprising COMP, DFFR, INV1, INV2, INV3 and the integrator can be viewed as one for on average reducing to zero OTA output voltage departure from $V_{STANDARD}/2$, insofar as analyzing the quiescent-output voltage condition for the chopper-stabilized differential amplifier OTA is concerned.

Figure 3:
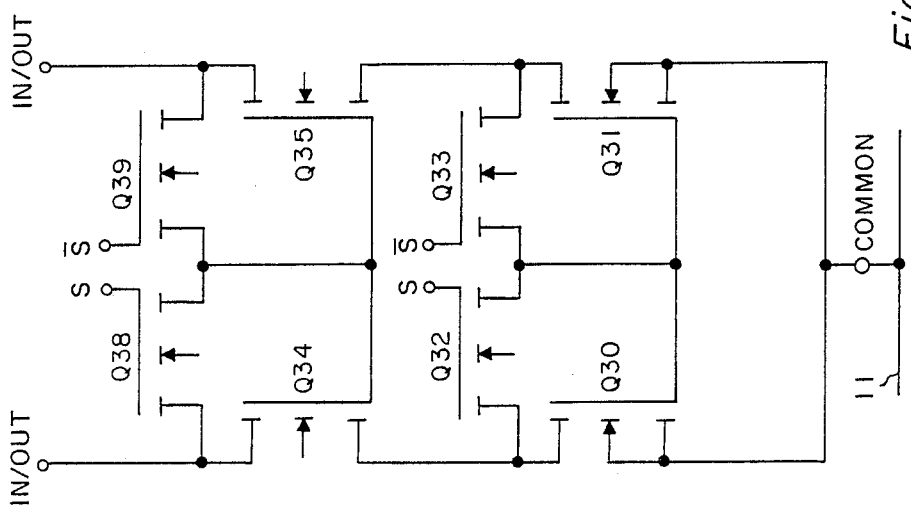

FIG. 3 shows a variation of FIG. 1 CMA3, wherein p-channel field-effect transistors Q36 and Q37 are replaced by n-channel field-effect transistors Q38 and Q39 respectively. Q38 gate electrode is controlled by the same phase S of chopping control signal as Q32 gate electrode; and Q39 gate electrode is controlled by the complementary phase $\bar{S}$ of chopping control signal, just as Q33 gate electrode is. The FIG. 3 current mirror amplifier requires a slightly more positive swing of S and $\bar{S}$ respective to potential at the source electrodes of Q30 and Q31, which makes low-supply-voltage operation less tolerable.

Figure 4:
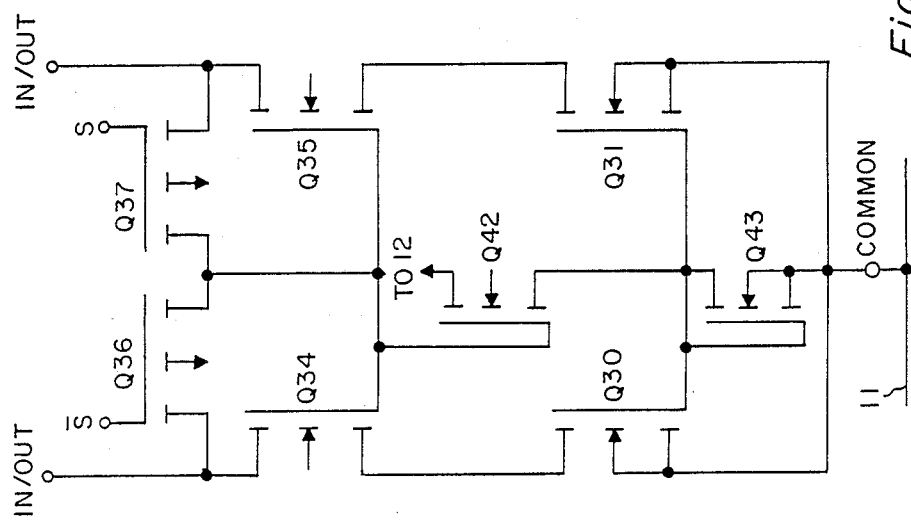
FIGS. 3 and 4 are each a schematic diagram of a respective alternative form of current mirror amplifier with controllably-reversible input and output ports as embody the invention in certain of its aspects.

FIG. 4 shows another variation of FIG. 1 CMA3. The single-pole/double-throw electronic switch comprising Q32 and Q33 is dispensed with, and the single-pole/double throw electronic switch comprising Q36 and Q37 is used to switch the degenerative feedback connection that applies gate potentials to Q30 and Q31. This feedback connection includes n-channel field-effect transistor Q42 in common-collector, or source-follower, connection to provide the offset potential needed to afforded Q30 and Q31 adequate quiescent drain potentials. An enhancement-mode n-channel field-effect transistor Q43 is self-biased to provide a source load to Q42 that assures pull-down of Q30 and Q31 gate potentials when current input to the current mirror amplifier falls. Alternatively, Q43 gate potential may be supplied from an alternative biasing arrangement; for example, in the FIG. 4 current mirror amplifier replaces CMA3 in the FIG. 1 chopper-stabilized amplifier Q43 gate electrode may be biased from the same point as the gate electrode of the Q24 tail transistor. In either of its connections, the FIG. 4 current mirror amplifier resembles one shown in FIG. 3 of U.S. Pat. No. 4,008,441 issued Feb. 15, 1977 to O. H. Schade, Jr. and entitled "CURRENT AMPLIFIER". The input and output ports of this current mirror amplifier can be interchanged by electronic switching at higher rates than the FIG. 1 SMA3 because the source-follower action of Q42 can more rapidly change the charge condition at the interconnected gate electrodes of Q30 and Q31.

Looking back at CMA3 of FIG. 1 and its FIG. 3 variant, one skilled in the art and acquainted with the foregoing description of CMA3 may discern that its elements Q30, Q31, Q32 and Q33 of themselves from a current mirror amplifier having controllably reversible input and output ports. This simpler "reversible" current mirror amplifier has a current gain that is more affected by potential variations across its output port (owing to early effect in Q31) than CMA3 or either of its FIG. 3 and FIG. 4 variants is, however, so is less suitable as an accurate balanced-to-single-ended signal converter. The regulation of the drain potentials of Q30 and Q31 to similar values in the preferred current mirror amplifiers makes current gain less susceptible to change responsive to voltage variations imposed across their output ports.

A number of current mirror amplifiers exhibit high degrees of symmetry as between their input and output circuitry, lending them to being controllably reversed by suitable switching, as described above for selected ones of such current mirror amplifiers, and as so modified these current mirror amplifiers embody the invention in one of its aspects.

Figure 5:
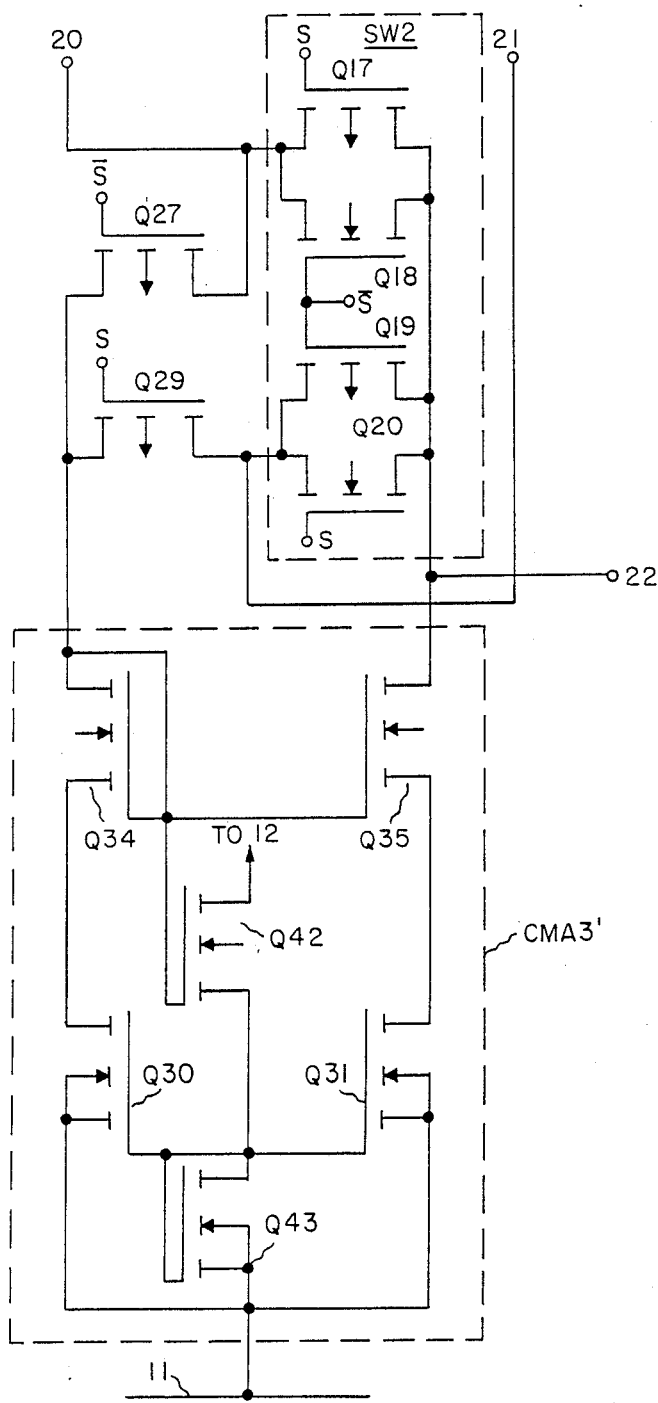
FIG. 5 is a schematic diagram of a modification that can be made to the FIG. 1 chopper-stabilized operational transconductance amplifier, which modified amplifier also embodies the invention.

FIG. 5 shows a modification that can be made to the FIG. 1 chopper stabilized amplifier, which is more tolerant of any departure from minus unity of the forward current gain of the current mirror amplifier used instead of CMA3. As thusfar described, the current mirror amplifier with electronic switching to interchange its input and output ports has been of a type wherein ones arranges to switch between input/output ports 20, 21 the direct-coupled feedback connection for conditioning one of the cascade connections Q30, Q34 and Q31, Q35 to conduct applied input current. This approach requires symmetry of the current mirror amplifier and extremely careful matching of the drain current versus source-to-gate voltage characteristics of the component transistors, especially Q30 and Q31.

In FIG. 5 a different approach is taken. The input and output ports of a current mirror amplifier CMA3', which need not be of symmetric construction, are interchanged using an electronic switch that functions as a double-pole, double-throw switch. In the chopper stabilized operational transconductance amplifier the output switch SW2 can be subsumed in this double-pole, double-throw electronic switch to provide one pole thereof, as shown in FIG. 5. The other pole of the electronic switch is provided by p-channel field-effect transistors Q27 and Q29, the gate electrodes of which receive S̄ and S phases respectively of chopper control signal. The particular CMA3' current mirror amplifier shown functions similarly to the FIG. 4 current mirror amplifier, for S high and S̄ low, or for S low and S̄ high. This current mirror amplifier is representative of a wide variety of current mirror amplifiers that one skilled in the art will consider using. Also one skilled in the art will be aware of a number of circuit variations for implementing the double-pole, double-throw electronic switch.

While only certain preferred features of the invention have been illustrated and described herein, many modifications and changes will occur to those skilled in the art and acquainted with the foregoing disclosure. It is, therefore, to be understood that the appended claims are intended to cover all such modifications and changes as fall within the true spirit of the invention.

What is claimed is:

1. A current mirror amplifier comprising:
   first, second and third terminals;
   first and second two-port devices, each having a respective input port for receiving a respective input voltage and a respective output port for conducting current in a measure controlled by its respective control voltage;
   means for connecting the output port of said first two-port device so as to conduct any flow of current between said first and third terminals;
   means for connecting the output port of said second two-port device so as to conduct any flow of current between said second and third terminals;
   regulating means for regulating the value of the input voltages applied to the input ports of said first and second two-port devices to condition their output ports for conducting respective output currents each of the same magnitude as an input current, said regulating means including
   means responsive to first control conditions for selecting said any flow of current between said first and third terminals as said input current and responsive to second control conditions for selecting said any flow of current between said second and third terminals as said input current.

2. A current mirror amplifier as set forth in claim 1 wherein said first and second two-port devices are first and second enhancement-mode field effect transistors of the same conductivity type, each having its input port between source and gate electrodes thereof and having its output port between its said source electrode and a drain electrode thereof.

3. A current mirror amplifier characterized by controllably-reversible input and output ports, said current mirror amplifier comprising:
   first, second and third terminals;
   first and second transistors of same conductivity type, each having respective first and second electrodes, having a respective principal conduction path between its first and second electrodes, and having a respective third electrode, the potential difference between the second and third electrodes of each of said first and second transistors controlling the conductance of its said principal conduction path;
   means for connecting the first electrode of said first transistor to said first terminal;
   means for connecting the first electrode of said second transistor to said second terminal;
   means for connecting the second electrode of said first transistor to said third terminal;
   means for connecting the second electrode of said second transistor to said third terminal;
   a first circuit node, the potential at which is applied to the third electrodes of said first and second transistors;
   a first controlled device responsive to a first control signal for selectively applying the potential at the first electrode of said first transistor to said first circuit node;
   a second controlled device responsive to a second control signal for selectively applying the potential at the first electrode of said second transistor to said first circuit node; and means for applying first and second control signals for selecting only one of said first and second controlled devices to apply potential to said first circuit node during normal operation, whereby, when said first controlled device applies potential to said first circuit node and said second controlled device doe not, a port of said current mirror amplifier between said third and first terminals is conditioned to function as an input port, and a port of said current mirror between said third and second terminals is conditioned to function as an output port, and whereby, when said second controlled device applies potential to said first circuit node and said first controlled device does not, the port of said current mirror amplifier between said third and second terminals is conditioned to function as an input port, and the port of said current mirror amplifier between said third and first terminals is conditioned to function as an input port.

4. A current mirror amplifier as set forth in claim 3 wherein said first and second transistors are of similar construction and device dimensions, thereby to cause the current gain between the input and output ports of said current mirror amplifier to have a magnitude of unity.

5. A current mirror amplifier as set forth in claim 3 wherein said first and second transistors are enhancement-mode field effect transistors, the first electrodes of which are drain electrodes, the second electrodes of which are source electrodes, and the third electrodes of which are gate electrodes.

6. A current mirror amplifier as set forth in claim 3 wherein said means for connecting the second electrode of said first transistor to said third terminal and said means for connecting the second electrode of said second transistor to said third terminal provide respective direct connections without introducing any substantial impedance to currents of the frequencies of interest, including zero frequency or direct currents.

7. A current mirror amplifier as set forth in claim 6 wherein said first circuit node connects to each of the third electrodes of said first and second transistors without substantial intervening impedance at frequencies of interest.

8. A current mirror amplifier as set forth in claim 3 wherein said first controlled device comprises:
a third transistor, having first and second electrodes which connect to separate ones of said first terminal and said circuit node, having a principal conduction path between its first and second electrodes, and having a third electrode for receiving an electric potential applied as said first control signal; and
wherein said second controlled devices comprises:
a fourth transistor, having first and second electrodes which connect to separate ones of said second terminal and said first circuit node, having a principal conduction path between its first and second electrodes, and having a third electrode for receiving an electric potential applieas as said second control signal.

9. A current mirror amplifier as set forth in claim 3 including:
third and fourth transistors of said same conductivity type, each having respective first and second electrodes having a respective principal conduction path between its first and second electrodes, and having a third electrode, the potential difference between the second and third electrodes of each of said third and fourth transistors controlling the conduction of its said principal conduction path, the first and second electrodes of said third transistor respectively connecting to said first terminal and to the first electrode of said first transistor, the principal conduction path of said third transistor being the sole means for connecting the said first terminal to the first electrode of said first transistor, the first and second electrodes of said fourth transistor respectively connecting to said second terminal and to the first electrode of said second transistor, the principal conduction path of said fourth transistor being the sole means for connecting said second terminal to the first electrode of said second transistor;
a second circuit node, the potential of which is applied to the third electrodes of said third and fourth transistors;
a third controlled device responsive to a third control signal for selectively applying the potential at said first terminal to said second circuit node; and
a fourth controlled device responsive to a fourth control signal for selectively applying the potential at said second terminal to said second circuit node.

10. A current mirror amplifier as set forth in claim 9 wherein said second circuit node connects to each of the third electrodes of said third and fourth transistors without substantial intervening impedance at frequencies of interest.

11. A current mirror amplifier as set forth in claim 10 wherein said first controlled device includes a fifth transistor, having a principal current conduction path between respective first and second electrodes thereof connected to separate ones of said first circuit node and the first electrode of said first transistor, and having a respective third or electrode receptive of said first control signal;
wherein said second controlled device includes a sixth transistor having a principal current conduction path between respective first and second electrodes thereof connected to separate ones of first circuit node and the first electrode of said second transistor, and having a respective third electrode receptive of said second control signal; wherein said third controlled device includes a seventh transistor, having a principal current conduction path between first and second electrodes thereof connected to separate ones of said second circuit node and said first terminal and having a third electrode receptive of said third control signal; and wherein said fourth controlled device includes an eighth transistor having a principal current conduction path between first and second electrodes thereof connected to separate ones of said second circuit node and said second terminal and having a third electrode receptive of said fourth control signal.

12. A current mirror amplifier as set forth in claim 11 wherein said seventh and eighth transistors are of a conductivity type complementary to that of said fifth and sixth transistors; wherein said first and fourth control signals are of a similar sense; and wherein said second and third control signals are of another similar sense opposite to that of said first and fourth control signals.

13. A current mirror amplifier as set forth in claim 12 wherein said fifth and sixth transistors are of said same conductivity type.

14. A current mirror amplifier as set forth in claim 11 wherein said fifth, sixth, seventh and eighth transistors are alike in conductivity type; wherein said first and third control signals are of similar sense; and wherein said second and fourth control signals are of another similar sense opposite to that of said first and third control signals.

15. A current mirror amplifier as set forth in claim 14 wherein said fifth, sixth, seventh and eighth transistors are of said same conductivity type.

16. A current mirror amplifier as set forth in claim 3 including:
 third and fourth transistors of said same conductivity type, each having respective first and second electrodes, having a respective principal conduction path between its first and second electrodes, and having a third electrode connected form said first circuit node, the potential difference between the second and third electrodes of each of said third and fourth transistors controlling the conduction of its said principal conduction path, the first and second electrodes of said third transistor respectively connecting to said first terminal and to the first electrode of said first transistor, the principal conduction path of said third transistor being the sole means for connecting the said first terminal to the first electrode of said first transistor, the first and second electrodes of said fourth transistor respectively connecting to said second terminal and to the first electrode of said second transistor, the principal conduction path of said fourth transistor being the sole means for connecting said second terminal to the first electrode of said second transistor.

17. A current mirror amplifier as set forth in claim 16 wherein said first controlled device comprises:
 a fifth transistor, having first and second electrodes which connect to separate ones of said first terminal and said first circuit node, having a principal conduction path between its first and second electrodes, and having a third electrode for receiving an electric potential applied as said first control signal; and wherein said second controlled device comprises:
 a sixth transistor, having first and second electrodes which connect to separate ones of said second terminal and said first circuit node, having a principal conduction path between its first and second electrodes, and having a third electrode for receiving an electric potential applied as said second control signal.

18. A current mirror amplifier as set forth in claim 17 wherein the potential at the first circuit node is applied to the third electrodes of said first and second transistors by
 a seventh transistor having a first electrode connected to a supply voltage conditioning said seventh transistor for voltage-follower operation, having a principal current conduction path between its first electrode and a second electrode thereof which second electrode connects to the third electrodes of said first and second transistors, and having a third electrode connected from said first circuit node, the potential difference between the second and third electrodes of said seventh transistor controlling the conduction of its principal current conduction path.

19. A current mirror amplifier as set forth in claim 18 wherein the potential at the first circuit node is applied to the third electrodes of said first and second transistors by direct connections without substantial intervening impedance.

20. A combination comprising:
 first current supplying means for supplying a first quiescent current having a first signal current superposed thereon;
 second current supplying means for supplying a second quiescent current of substantially the same value of said first quiescent current;
 means for supplying a control signal capable of being in either of first and second conditions;
 a current mirror amplifier having a first terminal to which current supplied by said first current supplying means is applied, having a second terminal to which current supplied by said second current supplying means is applied, having a third terminal connecting for returning current to said first and second current supplying means, having a first port between its said third and first terminals, having a second port between its said third and second terminals, responding to a control signal being in its first condition to select its first port as its input port and its second port as its output port, responding to said control signal being in its second condition to select its second port as its input port and its first port as its output port, and exhibiting a current gain of unity magnitude between its input and output ports; and
 means responding to said control signal for selecting an output signal from the output port of said current mirror amplifier, which output signal is responsive to said first signal current but is substantially nonresponsive to said first and second quiescent currents.

21. A combination as set forth in claim 20 wherein said second current supplying means is of a type for supplying a second signal current superposed on said second quiescent current, whereby said output signal is responsive to a difference between said first and second signal currents.

22. A combination as set forth in claim 21 wherein said first and second signal currents are push-pull currents respective to each other.

23. A combination comprising:
 first current supplying means for supplying a first quiescent current having a first signal current superposed thereon;
 second current supplying means for supplying a second quiescent current of substantially the same value as said first quiescent current;
 means for supplying a control signal capable of being in either of first and second conditions;
 a current mirror amplifier having an input terminal having a common terminal connected for returning current to said first and second current supplying means, and exhibiting a current gain of unity magnitude between its input and output terminals; and
 an electronic switch of double-pole, double-throw type, responding to said first condition of said control signal to provide connections from said first and second current supplying means to provide connections from said first and second current supplying means to said input and output terminals respectively, and responding to said second condition of said control signal to provide connections from said first and second current supplying means to said output and input terminals respectively, which connections when so selectively made offer substantially no intervening impedance as would cause a consequential voltage drop thereacross.

24. A balanced-to-single-ended signal converter as set forth in claim 23 wherein said electronic switch includes:
first, second, third and fourth field effect transistors each having a respective gate electrode and a respective controlled conduction path, the controlled conduction path of said first transistor selectively connecting said first input terminal to the input connection of said current mirror amplifier, the controlled conduction path of said second transistor selectively connecting said second input terminal to the input connection of said current mirror amplifier, the controlled conduction path of said third transistor selectively connecting said second input terminal to the output connection of said current mirror amplifier, and the controlled conduction path of said fourth transistor selectively connecting said first input terminal to the output connection of said current mirror amplifier; and
means for applying said control signal to the gate electrodes of said first, second, third and fourth transistors in such phasing as to condition the controlled conduction paths of said first and third transistors to selectively connect when those of said second and fourth transistors do not and to condition the controlled conduction paths of aid second and fourth transistors to selectively connect when those of said first and third transistors do not.

25. A combination as set forth in claim 23 wherein said second current supplying means is of a type for supplying a second signal current superposed on said second quiescent current, whereby said output signal is responsive to a difference between said first and second signal currents.

26. A combination as set forth in claim 25 wherein said first and second signal currents are push-pull currents respective to each other.

27. A single-ended-output amplifier comprising:
an output terminal for said single-ended-output amplifier;
a push-pull-output amplifier, having an input port for receiving an input signal, and having first and second output terminals for supplying push-pull response currents to said input signal respectively superposed on similar-value quiescent currents;
means for supplying a control signal capable of being in either of first and second conditions;
a current mirror amplifier having a first terminal to which the first output terminal of said push-pull-output amplifier connects, having a second terminal to which the second output terminal of said push-pull-output amplifier connects, having a third terminal, having a first port between said first and third terminals, having a second port between said second and third terminals, responding to said control signal being in said first condition to select its first port as its input port and to select its second port as its output port, responding to said control signal being in said second condition to select its second port as its input port and to select its first port as its output port, and exhibiting a current gain of unity magnitude between its input and output ports; and
means responding to said control signal for selectively connecting one of said first and second terminals to said output terminal for said single-ended-output amplifier, said first terminal being selected for such connection responsive to said control signal being in its second condition, and said second terminal being selected for such connection responsive to control signal being in its first condition.

28. A single-ended-output amplifier as set forth in claim 27 wherein said push-pull-output amplifier is of single-ended-input type.

29. A single-ended-output amplifier as set forth in claim 27 wherein said push-pull-output amplifier has a differential-input circuit.

30. A single-ended-output amplifier as set forth in claim 27 wherein said push-pull-output amplifier has a differential input circuit between first and second input terminals thereof, but is provided with
means for connecting the first and second input terminals of said push-pull-output amplifier to receive a single-ended input signal.

31. A single-ended output amplifier as set forth in claim 30 wherein said means for connecting the first and second input terminals of said push-pull-output amplifier to receive a single-ended signal comprises:
means responding to the first condition of said control signal to apply said single-ended input signal to the first input terminal of said push-pull-output amplifier;
means responding to the first condition of said control signal to apply a reference level to the second input terminal of said push-pull-output amplifier;
means responding to the second condition of said control signal to apply said single-ended input signal to the second input terminal of said push-pull-output amplifier; and
means responding to the second condition of said control signal to apply said reference level to the first input terminal of said push-pull-output amplifier.

32. A single-ended-output amplifier as set forth in claim 31 arranged to be chopper-stabilized by being included in combination with:
means for generating a control signal that alternates at a chopping rate between being in said first condition and being in said second condition.

33. A chopper-stabilized amplifier as set forth in claim 32 included in an integrator together with a capacitor for degeneratively feeding back signal from the output terminal of said single-ended amplifier to the one of said first and second input terminals of said push-pull-output amplifier selected to receive input signal.

34. A chopper-stabilized amplifier included in an integrator as set forth in claim 33 wherein said integrator is included in a delta-sigma analog-to-digital converter.

35. A single-ended-output amplifier comprising:
an output terminal for said single-ended-output amplifier;
a push-pull-output amplifier, having an input port for receiving an input signal, and having first and second output terminals for supplying push-pull response currents to said input signal respectively superposed on similar-value quiescent currents;
means for supplying a control signal capable of being in either of first and second conditions;

a current mirror amplifier having an input terminal, having an output terminal connected to the output terminal of said single-ended-output amplifier, and exhibiting a current gain of unity magnitude between its input and output terminals; and an electronic switch of double-pole, double-throw type, responding to said first condition of said control signal to provide connections from said first and second current supplying means to said input and output terminals respectively, and responding to said second condition of said control signal to provide connections from said first and second current supplying means to said output and input terminals respectively, which connections when so selectively made offer substantially no intervening impedance as would permit a consequential voltage drop thereacross.

36. A single-ended-output amplifier as set forth in claim 35 wherein said push-pull-output amplifier is of a single-ended-input type.

37. A single-ended-output amplifier as set forth in claim 35 wherein said push-pull-output amplifier has a differential-input circuit.

38. A single-ended-output amplifier as set forth in claim 35 wherein said push-pull-output amplifier has a differential input circuit between first and second input terminals thereof, but is provided with means for connecting the first and second input terminals of said push-pull-output amplifier to receive a single-ended input signal.

39. A single-ended output amplifier as set forth in claim 38 wherein said means for connecting the first and second input terminals of said push-pull-output amplifier to receive a single-ended signal comprises:

means responding to the first condition of said control signal to apply said single-ended input signal to the first input terminal of said push-pull-output amplifier;

means responding to the first condition of said control signal to apply a reference level to the second input terminal of said push-pull-output amplifier;

means responding to the second condition of said control signal to apply said single-ended input signal to the second input terminal of said push-pull-output amplifier; and means responding to the second condition of said control signal to apply said reference level to the first input terminal of said push-pull-output amplifier.

40. A single-ended-output amplifier as set forth in claim 39 arranged to be chopper-stabilized by being included in combination with:

means for generating a control signal that alternates at a chopping rate between being in said first condition and being in said second condition.

41. A chopper-stabilized amplifier as set forth in claim 40 included in an integrator together with a capacitor for degeneratively feeding back signal from the output terminal of said single-ended amplifier to the one of said first and second input terminals of said push-pull-output amplifier selected to receive input signal.

42. A chopper-stabilized amplifier included in an integrator as set forth in claim 41 wherein said integrator is included in a delta-sigma analog-to-digital converter.

43. A differential amplifier comprising:

first and second power supply terminals for receiving first and second operating voltages respectively;

first and second enhancement-mode field-effect transistors of a first conductivity type, having respective source, drain and gate electrodes;

means connecting said first and second field-effect transistors for source-follower operation including connections of their drain electrodes to said first power supply terminal;

means for applying an input voltage between the gate electrodes of said first and second field-effect transistors, said means for applying being of a type wherein the gate potential of one of said first and second field effect transistor is at times outside the range between said first and second operating voltages;

third and fourth field effect transistors of a second conductivity type complementary to said first conductivity type, having respective source, drain and gate electrodes;

means connecting said third and fourth transistors in long-tailed pair configuration, including the following elements of this claim;

a connection of the gate electrode of said third transistor from the source electrode of said first transistor;

a connection of the gate electrode of said fourth transistor from the source electrode of said second transistor;

a fifth field-effect transistor of said second conductivity type, having a source electrode connected to said first power supply terminal, having a drain electrode to which the source electrodes of said third and fourth transistors each connect, and having a gate electrode; and means biasing the gate electrode of said fifth transistor respective to said first electrode voltage for conditioning said fifth transistor to conduct a tail current of said long-tailed pair configuration.

* * * * *